(12) United States Patent
Roozeboom et al.

(10) Patent No.: US 9,530,857 B2
(45) Date of Patent: Dec. 27, 2016

(54) ELECTRONIC DEVICE, ASSEMBLY AND METHODS OF MANUFACTURING AN ELECTRONIC DEVICE INCLUDING A VERTICAL TRENCH CAPACITOR AND A VERTICAL INTERCONNECT

(75) Inventors: Freddy Roozeboom, Eindhoven (NL); Adrianus Alphonsus Jozef Buijsman, Nijmegen (NL); Patrice Gamand, Douvres la Delivrande (FR); Antonius Lucien Adrianus Maria Kemmeren, Eindhoven (NL); Gerardus Tarcisius Maria Hubert, Eindhoven (NL)

(73) Assignee: Tessera Advanced Technologies, Inc., San Jose, CA (US)

( * ) Notice: Subject to any disclaimer, the term of this patent is extended or adjusted under 35 U.S.C. 154(b) by 1014 days.

(21) Appl. No.: 10/560,717

(22) PCT Filed: Jun. 11, 2004

(86) PCT No.: PCT/IB2004/050887
§ 371 (c)(1),
(2), (4) Date: Dec. 15, 2005

(87) PCT Pub. No.: WO2004/114397
PCT Pub. Date: Dec. 29, 2004

(65) Prior Publication Data
US 2006/0131691 A1    Jun. 22, 2006

(30) Foreign Application Priority Data

Jun. 20, 2003  (EP) ..................... 03300035
Mar. 10, 2004  (EP) ..................... 04300132

(51) Int. Cl.
H01L 23/12    (2006.01)
H01L 23/053   (2006.01)
(Continued)

(52) U.S. Cl.
CPC ... *H01L 29/66181* (2013.01); *H01L 21/76898* (2013.01); *H01L 23/481* (2013.01);
(Continued)

(58) Field of Classification Search
CPC .................... H01L 2924/00; H01L 2924/0002; H01L 2224/16225; H01L 23/481; H01L 21/76898; H01L 23/49827; H01L 28/55; H01L 27/10855; H01L 27/10814; H01L 28/40; H05K 1/162
(Continued)

(56) References Cited

U.S. PATENT DOCUMENTS 3,462,650 A    8/1969  Schutze et al.
4,017,885 A    4/1977  Kendall et al.
(Continued)

FOREIGN PATENT DOCUMENTS

CN    1308376 A     8/2001
EP    1154481 A2    11/2001
(Continued)

*Primary Examiner* — David Chen
*Assistant Examiner* — D. C.

(57) ABSTRACT

A semiconductor substrate comprises both vertical interconnects and vertical capacitors with a common dielectric layer. The substrate can be suitably combined with further devices to form an assembly. The substrate can be made in etching treatments including a first step on the one side, and then a second step on the other side of the substrate.

10 Claims, 6 Drawing Sheets

Figure 1:
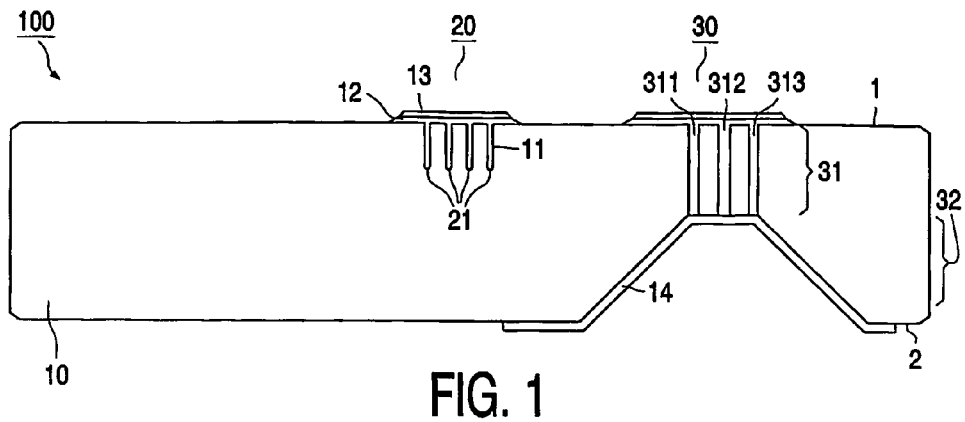

(51) Int. Cl.
  *H01L 29/66* (2006.01)
  *H01L 21/768* (2006.01)
  *H01L 23/48* (2006.01)
  *H01L 27/08* (2006.01)
  *H01L 29/06* (2006.01)

(52) U.S. Cl.
  CPC ...... *H01L 27/0805* (2013.01); *H01L 29/0657* (2013.01); *H01L 2224/05001* (2013.01); *H01L 2224/05009* (2013.01); *H01L 2224/0557* (2013.01); *H01L 2224/05568* (2013.01); *H01L 2224/16225* (2013.01); *H01L 2924/0002* (2013.01); *H01L 2924/00014* (2013.01); *H01L 2924/3011* (2013.01)

(58) Field of Classification Search
  USPC ............... 257/254, 311, 738, E27.092, 516, 301,257/68, E21.705, E21.627, E21.499; 333/184; 438/667, 386
  See application file for complete search history.

(56) References Cited

U.S. PATENT DOCUMENTS

| | | | |
|---|---|---|---|
| 5,488,253 A | 1/1996 | Matsuoka | |
| 5,495,117 A * | 2/1996 | Larson | 257/295 |
| 5,872,393 A * | 2/1999 | Sakai et al. | 257/664 |
| 5,905,279 A * | 5/1999 | Nitayama et al. | 257/301 |
| 5,998,292 A * | 12/1999 | Black | H01L 21/486 257/E23.011 |
| 6,025,226 A * | 2/2000 | Gambino et al. | 438/244 |
| 6,221,769 B1 * | 4/2001 | Dhong et al. | 438/667 |
| 6,268,619 B1 * | 7/2001 | Kosaki et al. | 257/276 |
| 6,384,468 B1 | 5/2002 | Bernstein et al. | |
| 6,538,300 B1 * | 3/2003 | Goldberger et al. | 257/532 |
| 6,559,499 B1 | 5/2003 | Alers et al. | |
| 6,617,681 B1 | 9/2003 | Bohr | |
| 6,630,705 B2 | 10/2003 | Maeda et al. | |
| 6,830,970 B2 * | 12/2004 | Gardes | 438/238 |
| 6,962,872 B2 | 11/2005 | Chudzik et al. | |
| 7,030,481 B2 * | 4/2006 | Chudzik et al. | 257/700 |
| 2001/0005046 A1 * | 6/2001 | Hsuan et al. | 257/686 |
| 2004/0108587 A1 | 6/2004 | Chudzik et al. | |

FOREIGN PATENT DOCUMENTS

| | | |
|---|---|---|
| JP | 07-135210 | 5/1995 |
| JP | 2001-237510 A | 8/2001 |
| JP | 2002-057305 | 2/2002 |
| JP | 2003-503855 | 1/2003 |
| JP | 2004-193614 A | 7/2004 |

* cited by examiner

ELECTRONIC DEVICE, ASSEMBLY AND METHODS OF MANUFACTURING AN ELECTRONIC DEVICE INCLUDING A VERTICAL TRENCH CAPACITOR AND A VERTICAL INTERCONNECT

The invention relates to an electronic device comprising a semiconductor substrate having a first and a second side and provided with a capacitor and a vertical interconnect through the substrate extending from the first to the second side, on which first side the capacitor is present.

The invention also relates to an assembly therewith.

The invention further relates to methods of manufacturing such an electronic device.

Such an electronic device is known from EP-A 1154481. The known device is an interposer that is made of a heat-resistant insulator that is preferably silicon, but alternatively of glass or resin. Through-holes are made with a laser. Wiring patterns are then formed on both the first side and the second side of the device, said wiring pattern extending at the side walls of the through-holes and thus forming the vertical interconnect. Gold or solder bumps may be applied on the second side for connection to a mounting board. A capacitor is present on the first side of the substrate. The capacitor is a thin-film capacitor with a dielectric sandwiched between a first and second electrode. The first electrode forms herein part of the wiring pattern. The dielectric layer is formed preferably of a ferroelectric substance, such as strontium titanium oxide or lead zirconium titanate. Thus, a capacitor having a high capacitance density is obtainable.

It is a disadvantage of the known device, however, that application of ferroelectric substances calls for further conditions and requirements to the processing. Generally, specific metal layers such as platinum or a conductive oxide are applied as electrode material for capacitors with such ferroelectric substances. An alternative seems to be the provision of an aftertreatment in diminishing atmosphere after the provision and sintering of the ferroelectric substance. This aftertreatment at a high temperature is not yet fully developed, however, and has the problem that all layers in the device must be able to withstand the temperature and conditions applied. Furthermore, the ferroelectric substances are sensitive to delamination and cracking, which is certainly the case if the first bottom electrode forms part of the wiring pattern and can thus be expected to have a relatively rough surface.

It is therefore an object of the invention to provide an electronic device of the kind mentioned in the opening paragraph, which combines the electrical connection through the substrate with the presence of capacitors with a high capacitance density and which is reliable and manufacturable.

This object is achieved in the invention in that the capacitor is a vertical trench capacitor provided with a plurality of trenches in which a layer of dielectric material is present between a first and a second conductive surface, said layer of dielectric material also being used as insulation between the substrate and the vertical interconnect.

Vertical capacitors are alternatives to ferroelectric capacitors for providing a high capacitance. The high capacitance is herein achieved with an increase of the surface area They are known per se, such as for instance from U.S. Pat. No. 4,017,885. However, vertical capacitors cannot directly be substituted for ferroelectric capacitors. The same process is needed for making the through-holes and making the trenches of the vertical capacitors, but with different parameter settings. Hence, the manufacture of the trench capacitors and the vertical interconnects cannot be combined, but should be combined subsequently.

This subsequent processing appears problematic as well, since the vertical interconnect must be adequately insulated from the substrate. If first the vertical capacitor is made, and then the interconnect, the capacitor and other layers made must be protected very well from the etching liquid or etching gas. The etching liquid or gas may easily open the interface between the substrate and the patterned layers and therewith lead to contamination, delamination and other undesired effects. The reverse order of making first the vertical interconnect and then the trench seems not available either. Not only will a large part of deposited material be removed through the vertical interconnect, but also an implantation step is required for the provision of a conductive surface in the vertical capacitor, which would be detrimental to the constitution of the vertical interconnect.

It is now the insight of the invention, that both the vertical capacitors and the vertical interconnects can be combined with good results by using the dielectric material of the trenches also as the insulating material for the vertical interconnect. Both vertical elements are thus processed simultaneously, with steps carried out not only on the first side of the substrate, but also on the second side.

The resulting device has substantial advantages over the prior art; first of all, it is ensured that it has adequate high-frequency properties. Due to the insulating material parasitic currents through the substrate are prevented, at least to a large extent. This insulating material can be effectively deposited, without a mask and including a thermal oxide layer.

Due to the presence of the vertical interconnects, it is possible to provide very short connections to ground. Short connections to ground are important for RF applications, as the ground is the reference. If the ground is not adequately grounded due to impedances of interconnects, the complete RF design may function detrimentally. Furthermore, short connections for signal lines reduce the impedances. This is particularly true, since the signal lines are not only shorter, but can be provided at locations so as to minimize parasitic behaviour or to establish microstrip behavior.

Moreover, the high capacitance capacitors can be used as decoupling capacitors for any integrated circuit to be applied on the first side. This will dramatically reduce the number of external contacts needed. Finally, the capacitor of the invention has a low resistance compared to planar capacitors, which is particularly true for larger capacitance values of 20 nF and more, and especially for capacitors of more than 40 nF or more.

Besides, it is advantageous that one or more capacitors in the device of the invention can be used for more applications. Ferroelectric capacitors such as strontium titanium oxide show a dielectric adsorption. As a result of this open loop tranceivers with such capacitors for the PLL function do not give the required performance. Capacitors with another dielectric, such as silicon nitride or silicon oxide do not have this problem. Additionaly, the temparature stability of the dielectric constant of thin-film ferroelectric layers as far as currently available is less than optimal for applications in or together with transceivers.

It is another advantage of the device of the present invention as compared to that in the prior art that it enables the provision of any desired capacitance value. If a larger capacitance value is needed the capacitor will comprise a larger number of vertical trenches. Since the surface area on top of the vertical capacitors can be used for interconnects, resistors, inductors and the like, the larger capacitor does not give rise to a new design. Also, it is quite easy to provide capacitors with slightly different values while standard design rules can be respected.

In a preferred embodiment, the trenches of the interconnect are substantially filled with electrically conductive material. This filling of the trenches leads to a further reduction of the impedance of the vertical interconnect. It is noted that such filling is not foreseen in the prior art EP-A 1154481. The reason of this must be found in the actual diameter of the through-holes. Although the trenches of the interconnects are generally wider than those of the capacitors, the etching technique in which they are made allows relatively small diameters. With such small diameters the conductive material will first cover side walls but thereafter fill the trench. Moreover, the manufacture of the vertical interconnect generally occurs in a two-step process, wherein first etching is done from the one side and thereafter the trenches are opened from the opposite side. This manufacturing technique allows the via to be already filled halfway before it is opened.

In an even further embodiment, the vertical interconnect comprises a plurality of parallel through-holes through the substrate, each of which is filled with electrically conductive material. This construction allows the provision of a very low impedance. Not only does the resistance decrease due to the parallel circuitry, but also circular currents within the vertical interconnect are minimized that would otherwise give rise to parasitic inductance. Another advantage is that the filling material may be the same as that of the second conductive surface of the capacitor. This reduces the number of process steps. A suitable filling material is polycrystalline silicon, doped with a conventional dopant.

In another suitable embodiment, a first vertical interconnect is used for grounding and a second interconnect is used for signal transmission. Grounding and signal transmission are important aspects of the function of an interposing substrate if the device is used for RF applications. With the vertical interconnects, these functions can be fulfilled excellently.

In a further embodiment, the first and second vertical interconnects are designed so as to form a coaxial structure. The coaxial structure is one example of a microstrip. Such microstrips allow signal transmission with very limited impedance. Since the vertical interconnects are filled, contact pads may be provided on the second side of the substrate at the end of the vertical interconnects. Solder balls can be provided on such contact pads for connection to a printed circuit board. On the fist side the substrate is generally covered with an interconnect structure of a couple of layers. This allows each of the vertical interconnects to be contacted without being short-circuited. Also the coaxial structure may be transformed in the interconnect structure to any other type of microstrip, such as a transmission line or a coplanar wave guide. Aims of the interconnect structure are not only the contacting of the capacitors and any resistor and/or inductor present, but also the rerouting of the signal path, so as to fit to the bumps of an integrated circuit.

In another embodiment an integrated circuit is defined on the second side of the substrate. This option allows a further integration of functionality. The contact pads of the device will then be provided on the first side of the substrate, adjacent to and/or on top of the vertical capacitors. This embodiment looks particularly suitable for the application in smartcards. The advantage of this concept is that very large decoupling capacitors can be provided on the same substrate as the integrated circuit, without the need for additional space. Such a decoupling capacitor is part of the internal power supply circuit. The capacitor allows decoupling of the smartcard of any external power supply during a certain decoupling period. The decoupling period is then used for carrying out security-relevant operations. The very large decoupling capacitor thus allows that the decoupling period is extended, while at the same time no further surface area is needed. This construction of the decoupling capacitor is furthermore advantageous from a security point of view. In the current situation, both the capacitor and any data processing section are on the outer side of the smart card IC, and hence vulnerable to attack and misuse by unauthorized persons. By replacing the capacitor to the other side, only one of the two sides is present on the outer side. In a further embodiment, the device further comprises a scratch-protective, non-transparent layer. Such a layer, also called 'security coating' is specifically aimed at preventing access to the inside of the integrated circuit. The coating is for instance a ceramic layer with embedded particles that is provided via a sol-gel processing. The security coating could be applied on top of the integrated circuit, on top of the capacitor, or on both sides. It is understood that for this embodiment it is not absolutely necessary that the dielectric material of the vertical capacitor is the same as that of the insulation in the vertical interconnect.

Further embodiments are suitable to improve the characteristics of the electronic device. The substrate may comprise a high-ohmic zone which is present adjacent to the vertical capacitors and acts as a protection against parasitic currents. Such high-ohmic zone could circumfere the vertical capacitors and preferably extend from the first to the second side of the substrate. Under 'high-ohmic' is usually understood a zone of more than 500 $\Omega$/cm, preferably more than 1500 $\Omega$/cm. Such a zone acts as a barrier against any kind of interaction through the substrate. This is particularly advantageous for the reduction of inductive interaction.

In addition to the vertical capacitors, a planar capacitor may be present on the first side of the substrate. Whereas the vertical capacitor generally has a capacitance density in the order of 30 nF/mm$^2$ or more, a planar capacitor with the same dielectric material has a capacitance density in the order of 1-5 nF/mm$^2$. This allows a further fine-tuning of the desired capacitance. The presence of such capacitors furthermore allows that the electronic device can be applied for more than one application without substantial redesign.

It will be understood by the skilled person that many other elements can be present either on the first side and/or on the second side of the substrate. This includes both active and passive devices, wherein the actives are generally provided in the substrate and the passives are provided on top of the substrate. Also protective layers or specific packages may be provided. In order to cope with differences in thermal expansion between the device and any carrier such as a printed circuit board, an underfill or protective layer such as benzocyclobutene could be provided on the side to be attached to the carrier.

It is a further option that certain semiconductor devices are assembled in a cavity in the substrate. Their backside could be exposed to a heatsink by local removal of the substrate. Such local removal of the substrate can be realized in the same step as the etching from the second side to provide or to open the vertical interconnect. A more detailed description of such a process is given in the non-prepublished patent application EP03101729.6 (PHNL030659), which is herein included by reference. This allows devices with different substrate materials to be combined with a single interconnect structure that does not need the provision of any bond wires or solder balls. This has a functional advantage for RF applications in addition to the practical advantage of reduced assembly activities.

It is desired that the device of the invention is assembled together with a semiconductor device into an assembly. The semiconductor device will be attached to either the first side or the second side of the substrate. In order to contact the device, use can be made of a flip-chip process or of wirebonding or optionally of another surface mount technique. A flip-chip process is herein preferred in view of the lower impedance. The solder or metal bumps for the flip-chip process can be chosen corresponding to available processes as well as the desired pitch. The semiconductor device can thereafter be overmoulded with a protective layer. Alternatively, a heat-spreader could be provided on the side facing away from the substrate. Instead of one, more semiconductor and other electronic devices can be provided on the chosen side of the substrate. Examples of suitable semiconductor devices include devices that need a decoupling capacitor for adequate functioning, such as a power amplifier, a transceiver IC, a voltage controlled oscillator. The further electronic devices may be devices that cooperate with the semiconductor device to provide a functional subsystem. Examples hereof are ESD/EMI protection devices, bandpass filters, such as for instance BAW filters, impedance matching circuits.

The assembly is furthermore suitable for digital signal processing. In such an assembly, the semiconductor device is a microprocessor with an integrated or separate memory unit. Furthermore, a power supply signal generator is provided. The vertical capacitor herein has the function of buffering of the digital signal processing, that is both for decoupling purposes and for dampening power overshoot or drop.

The invention also relates to a method of manufacturing the device of the invention, and particularly to a method of manufacturing an electronic device comprising a semiconductor substrate having a first and a second side and provided with a capacitor and a vertical interconnect extending from the first to the second side, on which first side the capacitor is present and on which second side contact pads are present for connection to a carrier.

It is the object of the invention to provide such a method that is fully compatible with semiconductor manufacturing, without the need to provide special materials or extensive processing on the first and the opposite second side.

This object is achieved in that the method comprises the steps of:
providing first trenches in the substrate including the step of etching from the first side of the substrate;
providing second trenches in the substrate by etching from one side of the substrate and opening the second trenches by removing material from the opposite side of the substrate;
providing said first trenches with a conductive surface;
applying a layer of dielectric material on the substrate, covering at least the first side of the substrate and the inner faces of the first and second trenches; and
applying electrically conductive material in the first trenches and in the second trenches, which conductive material in the first trenches together with the layer of dielectric material and the conductive surface forms the capacitor, and which conductive material in the second trenches forms the vertical interconnects.

The method of the invention leads to vertical capacitors in combination with vertical interconnects. This is achieved in that the trenches of the capacitors are made simultaneously with the trenches of the vertical interconnects. The structure of a substrate with trenches that is then formed is afterwards processed in an integral way, so as to provide a dielectric layer and conductive material. A separation is thus made between the provision of the trenches and the provision of thin-film layers and structures on the substrate. This is enabled due to the fact that the second trenches (for the vertical interconnects) have a diameter on the first side of the substrate which diameter is slightly larger but still comparable to that of the first trenches.

Basically, there are two embodiments of the method; in the first embodiment the process starts with the simultaneous formation of the first trenches and the second trenches from the first side of the substrate in a single etching process. Thereafter, the second trenches are opened from the second side of the substrate. In the second embodiment, the process starts with the formation of the second trenches from the second side of the substrate; thereafter, the first trenches are formed; if the second trenches do not extend to the first side yet, then this etching step may be used to open the second trenches.

The application of electrically conductive material in the first trenches and the second trenches does not mean that this is the same material, neither that there is a common step in the application of this conductive material for both first and second trenches. It appears advantageous that the conductive material provided in the first trenches forms a seed layer in the second trenches, that is thereafter thickened in an electroplating process. Alternatively, the second trenches, and particularly the narrow part, could be completely filled by the said conductive material, for instance polycrystalline silicon or TiN, TiW or the like. In a further alternative, the second trenches are filled by the provision of a seed only at one of their ends, and subsequent electroplating. Due to the small diameter, that is of the first narrower part of the trenches, they will be filled directly in the plating process. The cavity-like larger part of the second trenches may be filled by electroplating. In the case where these cavity-like parts of the second trenches are provided as a first step, these could immediately be filled with electrically conductive material. For this purpose use can be made of various deposition techniques, including sol-gel deposition (for instance of Ag), electroplating, electroless deposition, etc.

It must be understood that the simplification of processes is achieved with the invention in that the process steps carried out on the second side of the substrate take place at a lower resolution that those on the first side. As a consequence, any aligning problems are substantially prevented. Also, the number of steps on the second side seems very limited: basically there are two lithographic steps: one for the provision of an etch mask and one for the definition of a wiring pattern. Particularly wet-chemical etching, wet-chemical deposition and electroplating are advantageous processes in this respect, as a number of substrates can be placed in a bath. It is then not necessary to lay the substrates down on their first side. The etch mask can be provided on the second side of the substrate before any other operation is carried out. Therewith, contamination and damage are prevented. The mask for the definition of the wiring pattern can be provided after the vertical interconnect is substantially filled, and after that the processing on the first side is substantially completed. The first side is then preferably covered by a protective layer.

Figure 5:
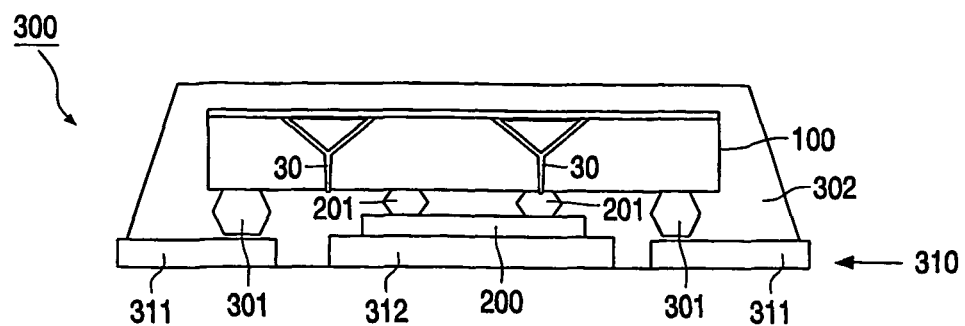
Figure 6:
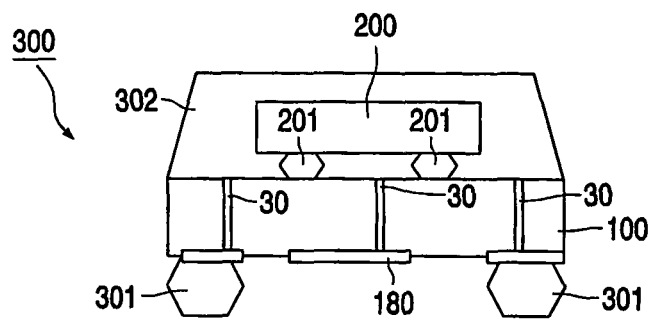
Figure 7:
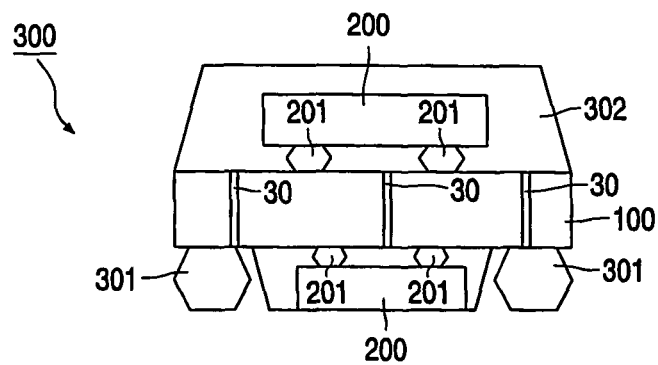

These and other aspects of the electronic device, the assembly and the method of the invention will be further elucidated with reference to the figures, in which:

FIG. 1 shows diagramatically a cross-sectional view of a first embodiment of the electronic device;

FIG. 2a-d show cross-sectional views of four stages in a first embodiment of the method;

FIG. 3a-e show cross-sectional views of five stages in a second embodiment of the method;

FIG. 4a-e show cross-sectional views of five stages in a third embodiment of the method;

FIG. 5-7 show different embodiments of the assembly including the device of the invention.

The Figures are not drawn to scale and purely diagrammatical. Identical reference numbers in different Figures refer to identical parts.

FIG. 1 shows in a cross-sectional view a first embodiment of the electronic device 100 of the invention. The device 100 comprises a substrate 10 with a first side 1 and an opposed second side 2. A vertical trench capacitor 20 is present and exposed on the first side 1 in addition to a vertical interconnect 30. Both the vertical interconnect 30 and the capacitor 20 in this embodiment comprise a plurality of trenches, 21, 311, 312, 313. However, although very much preferred, this is in principle not necessary. The vertical interconnect 30 comprises a first part 31 and a second part 32 of wider dimensions. As will become clear from the further discussion, the first part 31 is made by anisotropic etching from the first side 1, and the second part 32 is made by etching from the second side 2, and particularly wet-chemical etching. The device 100 comprises a couple of layers on its surfaces on the first and second sides 1,2 as well as in the trenches 21, 31, 32. Not shown here are first conductive surfaces 22 that constitute the bottom electrode of the vertical trench capacitor 20. A layer 11 of dielectric material is shown, that is present on nearly the whole surface. On top of the layer 11 of dielectric material, a layer 12 of electrically conductive material is present This layer is for instance polysilicon, but may alternatively be another material such as copper, sol-gel deposited silver, aluminum. On the first side 1 the capacitor 20 and the interconnect 30 are provided with a further metallisation of AlCu in this case. The layers 12 and 13 can be used as interconnect layers and may be mutually separated at certain positions by an insulating layer. The second part 32 of the interconnect has its surface covered with a layer 14, in this case of electroplated copper. The copper extends on the second side 2 of the substrate and forms the wiring pattern. The layer 14 may fill the second part of the interconnect 30.

FIG. 2 shows in cross-sectional view four stages in a first embodiment of the method. This first embodiment leads to a device 100 of the first embodiment, with minor variations.

Figure 2A:
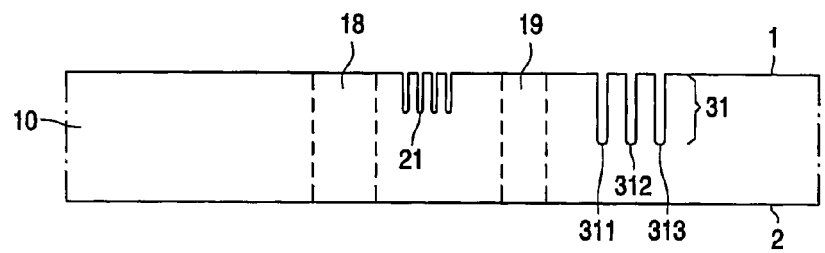

FIG. 2a shows the first stage of the method, after etching from the first side has taken place. Use is made herein of dry etching. A mask was used with circular opening of 1.5 µm diameter and 3.5 µm spacing in the area of the capacitors, and openings of 10 µm diameter and 14 µm spacing in the area of the vertical interconnect. The mask contained a stack of 1 µm thermal oxide and 1.3 µm photoresist. The dry etching was executed at wafer level, using substrates of 150 mm diameter. The resistivity of the wafers was in the order of 1 to 5 mΩ.cm, with the exception of high-ohmic zones 18,19 in the substrate, that had a resistivity of 1000-1500 Ωcm. The wafers were etched at room temperature in an ASE™ Inductively Coupled Plasma (ICP) reactor of STS. Typical etching conditions were 12 to 16 mTorr pressure and 20° C. chuck temperature, yielding etch rates of around 0.6 µm/min. With this process the macropore structures are characterized by a smooth pore wall with a rounded bottom and a pore depth uniformity of more than 97%. The trenches 21 with a mask opening of 1.5 µm diameter led to a depth of 40 µm and a diameter of 2 µm. The trenches 311,312,313 with a mask opening of 10 µm diameter led to a depth of 200 µm and a diameter of 12 µm. The pore depth is slightly larger than the mask opening due to underetch. Hence, the difference in openings in the mask led to differences in the pore depth, which phenomenon was exploited effectively in the invention.

Figure 2B:
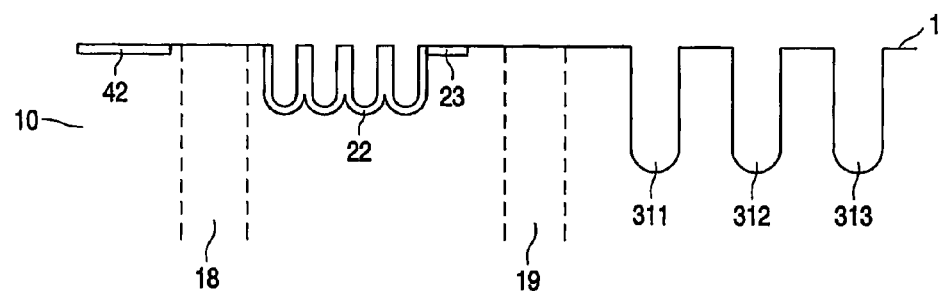

FIG. 2b shows a second stage in this first embodiment of the method. After the etching, the etch mask was removed, and another mask was deposited. Through this mask, for instance a nitride, an implantation step was carried out This implantation step provided a first conductive surface 22 in the trenches 21. The mask layout was such that also a conductive surface 42 was provided, to be used as bottom electrode of a planar capacitor. The high-ohmic zone 18 is present between the conductive surface 22 and 42, so as to prevent as much as possible any parasitic currents. Furthermore, a pad 23 was defined in connection with the conductive surface 22, so as to enable electrical connection of the first conductive surface 22. Use was made of a P indiffusion from a pre-deposited phosphorous silicate glass layer. The silicate glass layer was then removed by wet etching in 1% (v/v) HF.

Figure 2C:
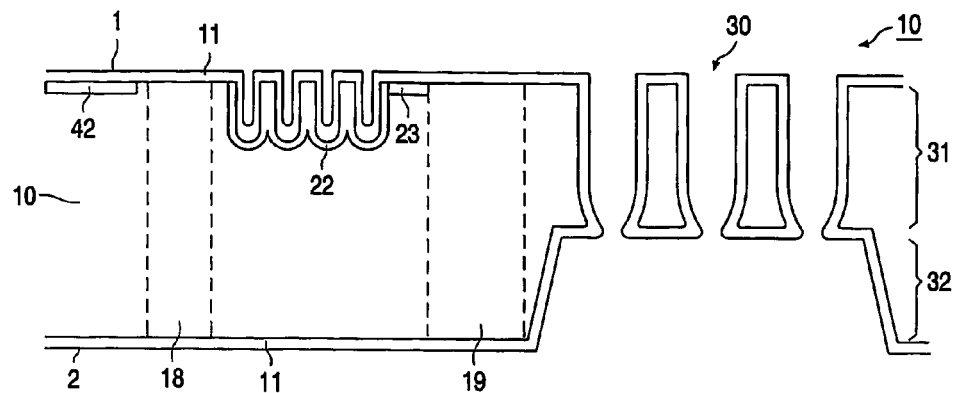

FIG. 2c shows a third stage in this first embodiment of the method. In a first step hereof, the vertical interconnects 30 were opened from the second side 2 of the substrate 10 by wet-chemical etching. This led to the second parts 32 of the interconnects 30. Use was made herein of a KOH etch. Alternative methods for the interconnect opening include power blasting or lasering. A photolithographical mask was thereto provided on the second side of the substrate. It is observed that in the same step saw lanes can be defined on the second side 2 of the substrate 10. This will simplify the separation of the substrate into individual devices, such that other methods than sawing can be used.

After the provision of the second parts 32 a dielectric layer 11 was deposited. The dielectric layer 11 was in this example a nominally 30 nm 'ONO' dielectric layer stack consisting of a thermal oxide (5 nm), LPCVD nitride (20 nm) and an oxide layer (5 nm) deposited by LPCVD TEOS. The layer was deposited without a mask, such that the complete surface of the device was covered with the dielectric layer 11.

In an alternative embodiment, the vertical interconnect 30 is not opened by wet-chemical etching from the second side, but by removal of part of the substrate. This can be done, by grinding and/or chemical-mechanical polishing. The grinding and/or polishing operation is particularly preferred in combination with the filling of the trenches 311-313 with a sacrificial layer, particularly a spin-on-glass material as known per se. This allows to finalize the thin-film structure on the first side 1 of the substrate 10 before opening the vertical interconnect 30, while at the same time the first side 1 constitutes a relatively planar surface. After opening of the vertical interconnect 30 from the second side, the spin-on-glass material can be removed in a gentle etching treatment, and both the first part 31 and the second part 32 of the interconnect 30 as far as present can be filled with electrically conductive material.

Figure 2D:
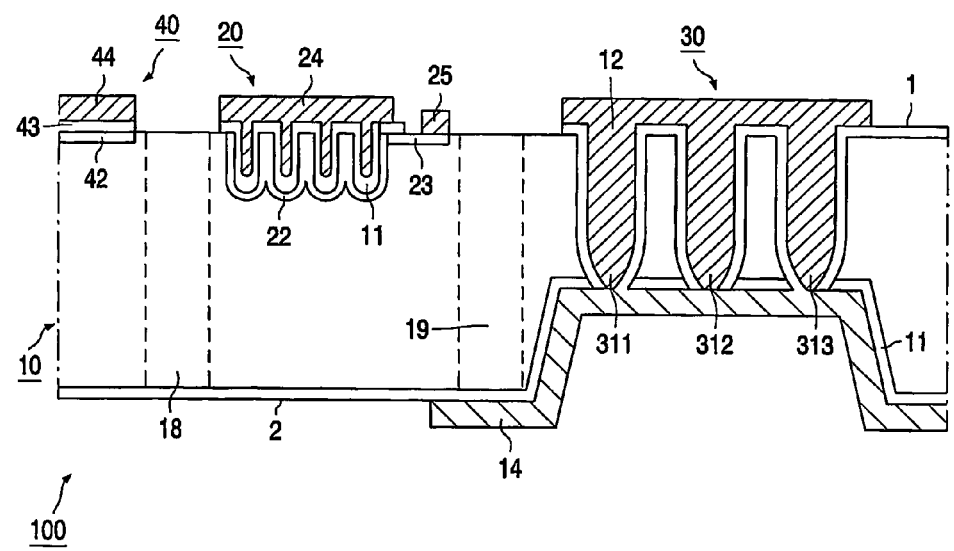

FIG. 2d shows the device 100 after that in the following steps the dielectric layer 11 is partially etched away, and a layer of electrically conductive material is provided to define a top electrode 44 of the planar capacitor 40, the second conductive surface 24 of the vertical capacitor 20, the contact 25 to the first conductive surface 22, and the filling of the first part 31 of the vertical interconnect 30. Part of the dielectric layer 11 forms a dielectric 43 of the planar capacitor 40. In this example, use is made of a 0.5 μm thick conductive layer of n-type in situ doped polysilicon. It was deposited by LPCVD from $SiH_4$ diluted $PH_3$. After a furnace anneal step of 30 minutes at 1000° C. the conductivity of the polysilicon is in the order of 1 mΩ/cm. Due to the use of parallel trenches 311, 312, 313 for the first part 31 of the vertical interconnect 30, this conductivity does not lead to an impedance that is too high. The trenches 311, 312, 313 are filled. In this filling process the polysilicon is first deposited on the side-walls and then grows in the kinetic regime. Although not explicitly shown, the polysilicon layer is also used as seed layer for the wiring pattern on the second side 2 of the substrate. This wiring pattern is grown by electroplating thereafter. Alternatively, use can be made of the polysilicon as seed layer also in the first part 31 of the interconnect 30. The trenches 311, 312, 313 in the first part will be completely filled, even if the seed material is present only at their ends.

Instead of the stack of oxide, nitride and oxide, other materials or combinations thereof may be applied as the dielectric material. Such a material can be any single layer of oxide, nitride or the like; any material with a higher dielectric constant, such as tantalum oxide or hafnium oxide, or the like. These layers can be suitably applied with (low pressure) chemical vapor deposition. With this technique, the complete surface as far as uncovered by a mask is provided of the desired material. An alternative is the use of wet-chemical deposition techniques, including sol-gel processing. It is preferred to apply an oxide layer, such as a thermal oxide, onto the substrate, in order to improve the adhesion. Another alternative is the use of a single nitride layer of about 15 nm—instead of the stack with 30 nm thickness. This increases the capacitance density from 30 to 90 $nF/mm^2$, but reduces the breakdown voltage from 25 to 7 V.

FIG. 3 shows in cross-sectional view five stages in a second embodiment of the method of the invention. Contrary to the first embodiment, the first step of the method is herein the provision of the second parts 32 of the interconnects 30 from the second side of the substrate 10. This has the major advantage that after this first step no photolithographical step is needed anymore on the second side 2 of the substrate, until the provision of the wiring pattern 14 in the last step of the method. For reasons of clarity, the trenches 21 of the vertical capacitor are not indicated in this Figure.

Figure 3A:
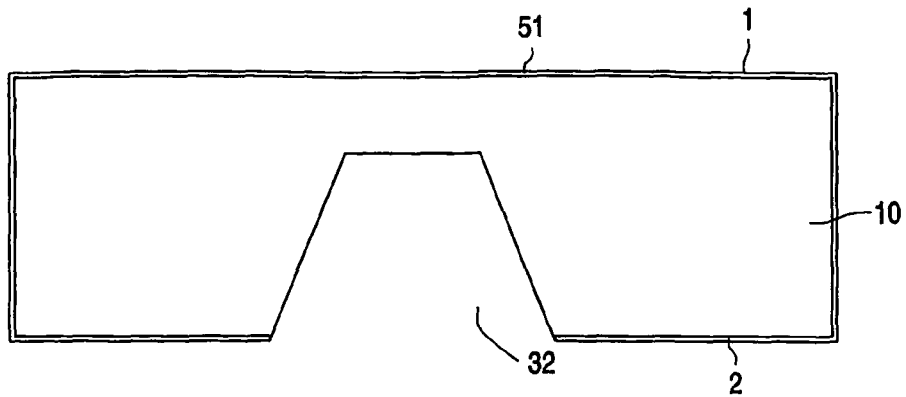

FIG. 3a shows the obtained structure after providing the second parts 32 of the interconnect 30 from the second side 2 of the substrate 10. In this case, this was carried out by first providing a mask 51 of oxide and nitride on all sides of the substrates 10, then patterning the mask 51 according to the desired pattern on the second side 2 of the substrate 10 and finally wet-chemical etching of the silicon substrate 10 with KOH.

Figure 3B:
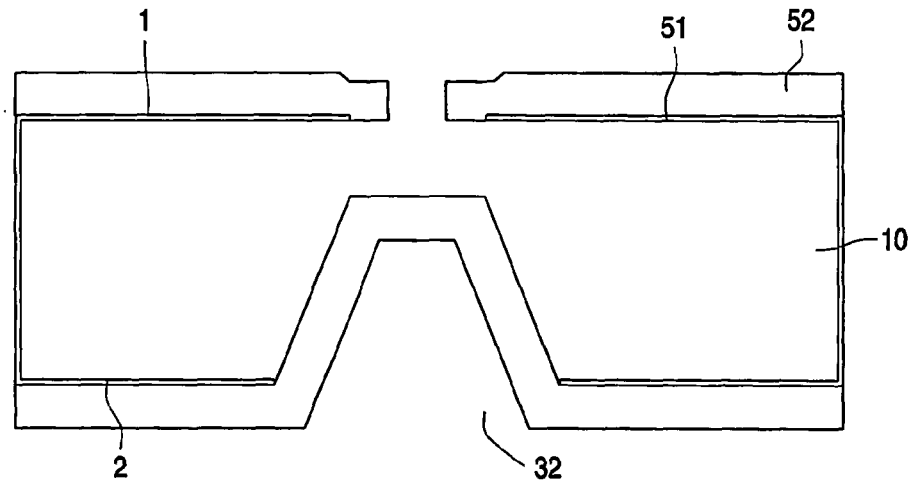

FIG. 3b shows the result at a second stage of the method. In this method, the the mask 51, or at least the nitride layer thereof, is patterned from the first side 1 of the substrate 10, and used for definition of high ohmic substrate zones (not-shown). Thereafter, a hard mask 52 is deposited and patterned on the first side 1 of the substrate 10 to define the first part 31 of the interconnect 30.

Figure 3C:
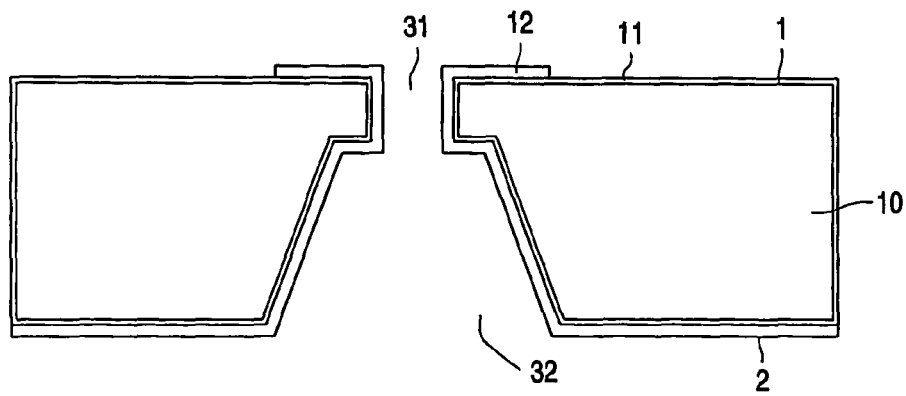

FIG. 3c shows the result at a third stage of the method. First the substrate 10 is etched from the first side 1 through the deposited mask. This etching can be done both with dry-etching and with wet-chemical etching. The etching is preferably carried out in the same step as the etching of trenches 21 to define a vertical capacitor. However, this is not essential. Thereafter, a conductive surface is provided in the manner described earlier with respect to the first embodiment of the method. Only hereafter the mask 51 is removed and the dielectric layer 11 is provided without a mask. Thereafter, a layer 12 of electrically conductive material, in this example polysilicon, is deposited and etched in accordance with any desired pattern.

Figure 3D:
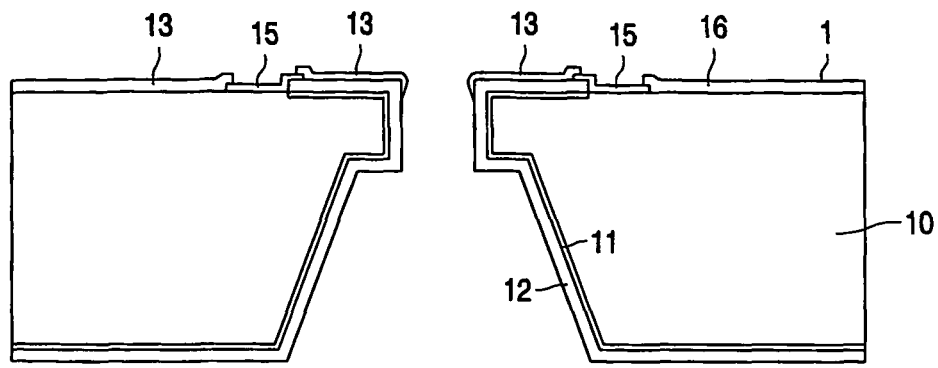

FIG. 3d shows the result at a fourth stage of the method. Contact windows have been etched in the dielectrical layer 11 on the first side 1 of the substrate 10. A thick dielectric layer 15, in this case TEOS, was deposited in part of the windows. Afterwards, a patterned layer 13 of metal has been deposited, while leaving the area of the TEOS layer free.

Figure 3E:
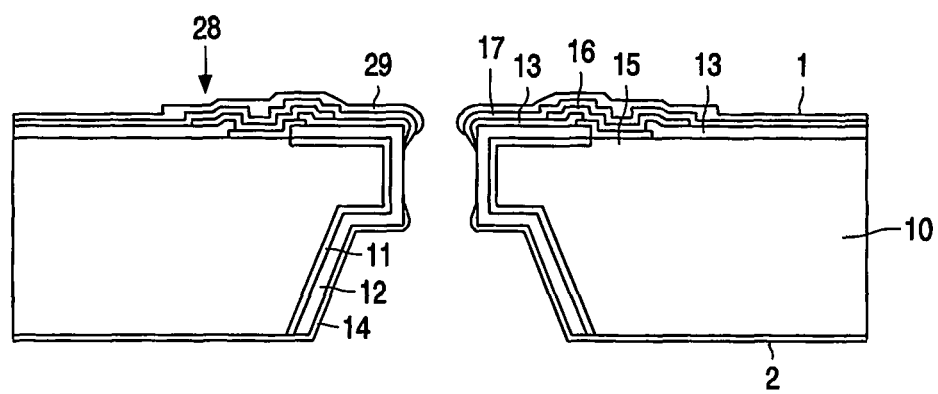

FIG. 3e shows the result at a fifth stage, after further steps. After provision of a patterned layer 16 of electrically insulating material, a patterned layer 17 of electrically conductive material was provided. This second patterned layer 17, for instance of AlSiCu, has a sufficient thickness, for instance in the order of 1-4 microns, for definition of high-quality inductors. The pattern of electrically insulating material of the layers 15,16 functions as a mechanical support, such that the overlying area in the second metal layer 13 can be used as bond pad 28. The complete structure is then covered with a passivation layer 29, for instance of silicon nitride, that will be locally removed in the area of the bond pad 28. The substrate 10 is thereafter thinned by grinding from the second side 2 thereof. This is of course by no means a necessary step.

FIG. 4 shows cross-sectional views of five stages in a third embodiment of the method of the invention. According to this method, the first side 1 of the substrate 10 is provided with vertical capacitors 20, whereas a semiconductor device 50 is defined at the second side 2 of the substrate.

Figure 4A:
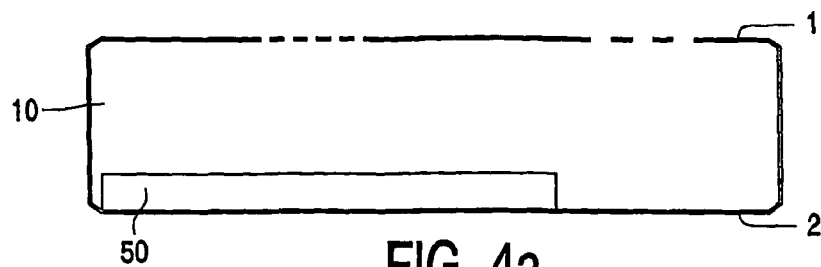

FIG. 4a shows the first stage of the method. It starts with the semiconductor device 50, for instance an integrated circuit, having been fully processed. The substrate 10 is thereto an n-type substrate provided on its second side 2 with a p-type epitaxial layer, in which p-wells have been defined that act as channels for the individual transistors. An $n^+$-connection is made from the second side 2 to the n-type substrate layer. This substrate layer has preferably a thickness of more than 40 μm and more preferably a thickness of at least more than 70 μm. The n-type layer provided with an $n^+$-layer on its second side, so as to enable the effective etching of the vertical capacitors. The second side 2 of the substrate 10 is hereafter protected by a temporary carrier. This could be a glass layer that is attached with a UV releasable adhesive. However, alternatively, it can be a two-layered stack of for instance a 1 micron thick oxide layer and a 1-10 micron thick photoresist layer. This stack can be present on all sides of the substrate 10, as is shown in FIG. 2a. This temporary carrier has the function to withstand pressure differences needed for dry etching, or to define the conditions for wet-chemical etching. The etching mask is furthermore applied to provide the desired implantation step, so as to create the first conductive surfaces of the vertical trench capacitors.

Figure 4B:
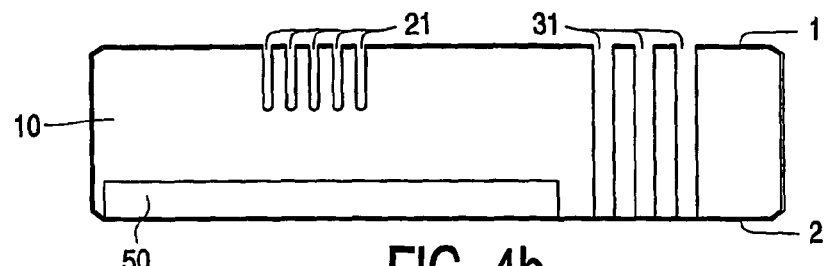

FIG. 4b shows the result after the provision of the first and second trenches 21, 31. Due to the differences in pitch, the depth of the pores is controlled.

Figure 4C:
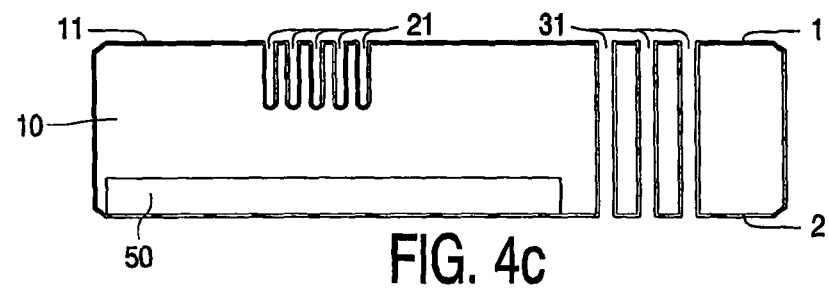

FIG. 4c shows the result after removal of the etch mask and after provision of the dielectric layer 11. The removal of the etch mask effectively provides the opening of the second trenches 21 into vertical interconnects 30. The dielectric layer 11 is provided both in the first trenches 21 and in the second trenches 31, and is used as dielectric of the vertical capacitor 20 and as insulation of the vertical interconnect 20.

In view of the fully processed integrated circuit, no thermal oxide is used as part of the dielectric layer. Instead, an LPCVD oxide layer is applied. This LPCVD oxide is hereafter locally removed so as to open the bond pads of the integrated circuit 50.

Figure 4D:
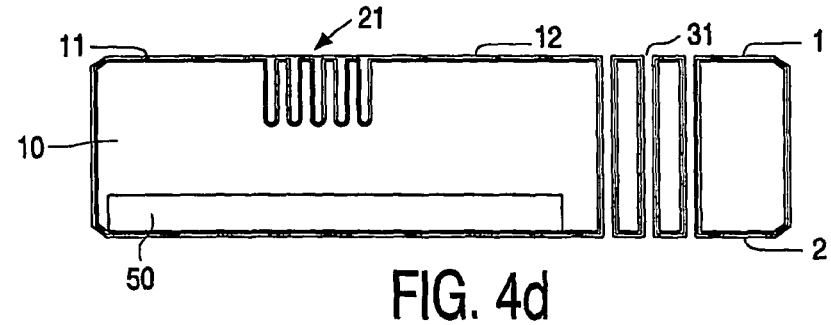

FIG. 4d shows the result after the provision of the second electrically conductive surface 12, which is in this case a layer of TiN. This layer 12 is herein used as a seed layer. Alternative deposition techniques for seed layers, such as sol-gel deposition of conductive oxides or sol-gel deposition of Ag.

Figure 4E:
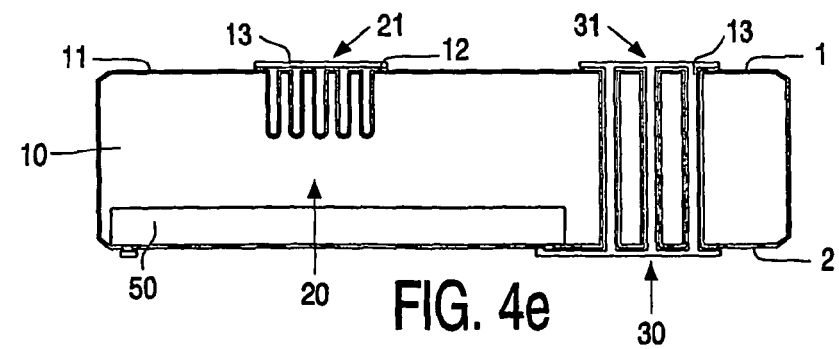

FIG. 4e shows the result after electroplating. Use is made of a mask, so as to define the desired wiring pattern. A further electrically conductive layer 13 is provided in the trenches 21,31. Thereafter, the parts of the seed layer under the mask are removed. The resulting device is very suitable for integration in a smartcard.

FIGS. 5, 6 and 7 show in diagrammatical cross-sectional views three examples of the assembly according to the invention. FIG. 5 shows an assembly 300 including the device 100, a leadframe 310 and a semiconductor device 200. The assembly makes use of a double flip chip construction, in which the semiconductor device 200 is electrically connected to the leadframe 310 via the electronic device 100. The bumps 201 between devices 100 and 200 are herein for instance gold bumps, and the bumps 301 between leads 311 of the leadframe 310 and the device 100 are for instance solder bumps of SAC (tin-silver-copper alloy). Thermally, the semiconductor device 200 is coupled to the heatsink 312 of the leadframe 310 directly.

This system is assembled in the following manner. Metal has been applied at the bond pad areas of both the device 100 and the active device 200. The device 100 is thereto provided with an underfill metal, such as a Ni or TiW layer on top of the bond pads. The metal is joined in a thermal compression treatment. Thereafter an underfill material is provided so as to fill the area between the device 100 and the active device 200. This underfill acts as a protective layer against moisture and other chemical contamination. The lead-frame 310 comprises a first and a second electrically conductive layer of Cu. The lead frame 310 is formed by skillfully etching it with a semi-etching technique, first from the first side and then from the second side or the other way around. This results in a heat sink 312 and in leads 311, while the heat sink 312 is also a contact surface. The heat sink 312 is customarily connected to the rest of the lead frame 310 by means of four wires. There is an open space under the leads 311, which is filled with a molding material. This provides a mechanical anchoring of the leadframe in the molding material. On the heatsink 312 a conductive adhesive is applied i.e. a silver containing glass epoxy adhesive. Solder dots are provided on the leads 311, for example, by printing with a stencil. The solder is here a low-melting SAC solder which contains over 96% Sn, 3% Ag and about 0.5% Cu.

In an example, the active device 200 together with the bumps 201 then has a thickness of 150±15 μm. The layers of the lead frame 310 have a thickness of 70±20 μm while in the location of the heat sink 312 relative to the device 100 there is a play of about 20 μm. The maximum spreading is thus about 55 μm. This spreading can be eliminated by remelting the solder balls and the solder dots, and slightly in the adhesive layer which, however, is chosen to be thin, for example of a thickness of about 20 μm. After the curing of the conductive adhesive, as a result of a heat treatment of 100-150° C., the heat sink 312 of the lead frame 310 is then pulled up when the adhesive layer shrinks. The result is a downward pressure. The resulting stress is relaxated by taking the bumps 201, 301 to beyond their reflow temperature. In this manner the bumps 201,301 are able to distort, and are particularly flattened.

Contrary to the other embodiments, the second side 2 of the device 100 is here not provided with contact pads for coupling to an external carrier. The vertical interconnects 30 provide in this construction a thermal path to the second side 2 of the electronic device 100. This improves the heat-spreading function of the device 100. Although not indicated, it is preferable to provide a connection from the second side 2 of the device 100 to the leadframe 310. Alternatively or additionally, the vertical interconnects 30 are used for grounding. Although two vertical interconnects 30 provide an additional resistance to the ground, this construction of the grounding has the advantage that the ground can be assumed to have the same potential everywhere in the device. Such well defined ground is particularly preferred if the assembly 300 comprises more than a single element. The vertical capacitors (not-shown) are herein provided on the side 1 of the device 100 facing the semiconductor device 200.

FIG. 6 shows an alternative embodiment of the assembly 300. This embodiment has practical advantages for multi-chip modules, in which more than one device 200 is assembled to the electronic device 100. This electronic device 100 acts here as the carrier of the assembly 300. The advantages are that devices 200 of different height can be included, and that there is no need for a simultaneous attachment of the devices 200 to an individual heatsinks 312 or one common heatsink 312. In addition, the assembly 300 of this embodiment is a chip-scale package without a leadframe, which can be provided at wafer level instead of at die level. Herewith a substantial cost reduction is achieved. A disadvantage of the embodiment is, however, the reduced possibilities for thermal dissipation. Although not shown, it is thereto preferred that the heatsink 180 on the second side of the device 100 is provided with solder balls or other means for thermal coupling to an external carrier.

FIG. 7 shows a further embodiment of the assembly 300. This embodiment is a more advanced version of the embodiment of FIG. 6. It has the further feature that devices 200 are attached to both the first side 1 and the second side 2 of the device 100. If desired, a leadframe with heatsink could be used as shown in FIG. 5.

The invention claimed is:

1. An electronic device comprising a semiconductor substrate having a first side and a second side; a vertical trench capacitor on the first side of the substrate, the vertical trench capacitor including a plurality of trenches in which dielectric material is present between first and second conductive surfaces; a vertical interconnect that extends through the substrate from the first side to the second side, the vertical interconnect being insulated from the substrate by dielectric material, the dielectric material of the vertical interconnect and the dielectric material of the vertical trench capacitor being a common material formed from a single deposition layer; wherein the substrate comprises a high-ohmic zone which is present adjacent to the vertical capacitors and acts as a protection against parasitic currents; and a planar capacitor on the first side of the substrate, the planar capacitor including dielectric material formed from the common material of the single deposition layer, and wherein the high-ohmic zone separates the planar capacitor from the vertical trench capacitor.

2. The electronic device as claimed in claim 1, wherein the vertical interconnect includes a plurality of parallel trenches each of which is substantially filled with an electrically conductive material, the dielectric material of the vertical interconnect being in direct contact with the semiconductor substrate in which the vertical trench capacitor is formed, along a sidewall of the vertical interconnect.

3. The electronic device as claimed in claim 1, wherein contact pads for coupling to an external carrier are present on the second side;
a first vertical interconnect is used for grounding and
a second vertical interconnect is used for signal transmission.

4. The electronic device as claimed in claim 3, wherein the first and second vertical interconnects are designed so as to form a coaxial structure.

5. An assembly comprising the electronic device of claim 1, and a semiconductor device, where the semiconductor device is electrically connected to bond pads present on the first side of the substrate.

6. The electronic device as claimed in claim 1, wherein the dielectric material of the vertical trench capacitor and the dielectric material of the vertical interconnect are formed by depositing a layer of dielectric material on the substrate and partially etching the deposited layer of dielectric material.

7. The electronic device as claimed in claim 1, wherein the vertical interconnect is substantially filled with a conductive material, the conductive material of the vertical interconnect and the second conductive surface of the vertical trench capacitor being formed from a common material of a single deposition layer of conductive material.

8. An electronic device comprising:
a semiconductor substrate having a first side and a second side;
a vertical trench capacitor on the first side of the substrate, the vertical trench capacitor including a plurality of trenches in which a dielectric material is present between first and second conductive surfaces; and
a vertical interconnect that extends through the substrate from the first side to the second side, the vertical interconnect being insulated from the substrate by a dielectric material, the dielectric material of the vertical interconnect and the dielectric material of the vertical trench capacitor being a common material formed from a single deposition layer, the vertical interconnect having a first part and a second part, where the first part is exposed on the first side of the substrate, is narrower than the second part and has a substantially cylindrical shape.

9. The electronic device as claimed in claim 8, wherein the first part of the vertical interconnect comprises a plurality of parallel through-holes that extend from the first side of the substrate to the second part of the vertical interconnect, each of the plurality of parallel through-holes being substantially filled with an electrically conductive material.

10. An electronic device comprising: a semiconductor substrate having a first side and a second side; a vertical trench capacitor on the first side of the substrate, the vertical trench capacitor including a plurality of trenches in which dielectric material is present between first and second conductive surfaces; and a vertical interconnect that extends through the substrate from the first side to the second side, the vertical interconnect being insulated from the substrate by dielectric material, the dielectric material of the vertical interconnect and the dielectric material of the vertical trench capacitor being common material formed from a single deposition layer, wherein the dielectric material extends over surfaces on both the first side and second side of the substrate.

* * * * *